(12) United States Patent
Kim et al.

(10) Patent No.: US 9,196,617 B2
(45) Date of Patent: Nov. 24, 2015

(54) SEMICONDUCTOR DEVICE AND METHOD FOR FABRICATING THE SAME

(71) Applicant: SK HYNIX INC., Icheon (KR)

(72) Inventors: Seung Hwan Kim, Seoul (KR); Jai Hoon Sim, Seongnam (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/495,746

(22) Filed: Sep. 24, 2014

(65) Prior Publication Data

US 2015/0008495 A1 Jan. 8, 2015

Related U.S. Application Data

(62) Division of application No. 13/445,798, filed on Apr. 12, 2012, now Pat. No. 8,872,259.

(30) Foreign Application Priority Data

Oct. 31, 2011 (KR) ........................ 10-2011-0112419

(51) Int. Cl.
*H01L 27/108* (2006.01)
*H01L 29/94* (2006.01)
*H01L 29/423* (2006.01)
*H01L 27/02* (2006.01)

(52) U.S. Cl.
CPC .... *H01L 27/10823* (2013.01); *H01L 27/10876* (2013.01); *H01L 27/10885* (2013.01); *H01L 29/4236* (2013.01); *H01L 29/42364* (2013.01); *H01L 27/0218* (2013.01)

(58) Field of Classification Search
None
See application file for complete search history.

(56) References Cited

U.S. PATENT DOCUMENTS

| 6,358,756 B1* | 3/2002 | Sandhu et al. ............... 438/3 |
| 2004/0041189 A1* | 3/2004 | Voshell et al. ............ 257/297 |
| 2007/0173027 A1 | 7/2007 | Rhie |

FOREIGN PATENT DOCUMENTS

KR  10-2009-0121475 A  11/2009

* cited by examiner

*Primary Examiner* — Evan Pert
*Assistant Examiner* — Shaka White (57) ABSTRACT

A semiconductor device and a method for fabricating the same are provided to prevent a floating body effect and reduce coupling capacitance between buried bit lines. The semiconductor device comprises a first pillar disposed over a semiconductor substrate and including a vertical channel region, a bit line located in the lower portion of the vertical channel region inside the first pillar and a semiconductor layer extended from the semiconductor substrate to one sidewall of the first pillar.

20 Claims, 8 Drawing Sheets

SEMICONDUCTOR DEVICE AND METHOD FOR FABRICATING THE SAME

CROSS-REFERENCE TO RELATED APPLICATION

The present application is a divisional of U.S. patent application Ser. No. 13/445,798, filed on Apr. 12, 2012, which claims priority to Korean patent application No. 10-2011-112419 filed on Oct. 31, 2011, which are incorporated by reference in their entirety.

BACKGROUND OF THE INVENTION

1. Technical Field

The present invention relates generally to a semiconductor device and a method for fabricating the same, and more particularly to a semiconductor device that comprises a vertical channel transistor and a method for fabricating the same.

2. Related Art

In general, a semiconductor, as a material which belongs in an intermediate range between a conductor and a nonconductor by material classification depending on electric conductivity, has similar properties as a nonconductor at a pure status. However, the electric conductivity of a semiconductor material may be increased by the addition of impurities or by other manipulations. Such semiconductor material is used for a semiconductor device such as a transistor by adding impurities and connecting the conductor. A semiconductor apparatus refers to an apparatus manufactured using such a semiconductor device to have various functions. A representative example of a semiconductor apparatus is a semiconductor memory apparatus.

A semiconductor memory apparatus comprises a plurality of unit cells including a capacitor and a transistor. The capacitor is used to store data and the transistor is used to transfer data between the capacitor and a bit line in response to a control signal (a word line) using a semiconductor property in which electric conductivity changes according to conditions. The transistor has three parts including a gate, a source, and a drain. Electric charges move between the source and drain according to the control signal input to the gate. The electric charges move between the source and drain through a channel region using semiconductor properties.

When a conventional transistor is fabricated on a semiconductor substrate, the gate is formed over the semiconductor substrate and then the source and drain are formed by implanting impurities into the semiconductor substrate. In this case, a space between the source and the drain below the gate is a channel region of the transistor. Such transistor having the vertical channel region occupies a given area of the semiconductor substrate. In complicated semiconductor memory apparatuses, it is difficult to reduce a unit size of a transistor in the semiconductor memory apparatus.

If the unit size of a semiconductor memory apparatus is reduced, the number of semiconductor memory apparatuses that can be produced per wafer may be increased to improve productivity. In order to reduce the unit size of the semiconductor memory apparatus, various methods have been suggested. One of these methods uses a vertical transistor having a vertical channel region instead of a conventional horizontal transistor having a horizontal channel region.

In the vertical transistor, a source and a drain are formed in the upper and the lower of pillars extended vertically, and a channel is formed between the source and the drain in up-and-down directions (vertically) along the pillars. The advantage of the vertical transistor is that a semiconductor cell may be manufactured in a narrower area than the horizontal transistor.

BRIEF SUMMARY OF THE INVENTION

Various embodiments of the present invention are directed to providing a body tied structure for connecting a pillar of a vertical transistor to a semiconductor substrate, thereby preventing a floating body effect and reducing coupling capacitance between buried bit lines.

According to one aspect of an exemplary embodiment, a semiconductor device comprises: a first pillar disposed over a semiconductor substrate and including a vertical channel region; a bit line located in the lower portion of the vertical channel region inside the first pillar; and a semiconductor layer extended from the semiconductor substrate to one sidewall of the first pillar.

The semiconductor layer is extended to the vertical channel region of the first pillar.

The semiconductor device further comprises a contact disposed at one sidewall of the vertical channel region of the first pillar. The contact is a region where a silicon of the first pillar is exposed.

The semiconductor layer includes SiGe or Si.

The upper end of the semiconductor layer is the middle of the vertical channel region in the first pillar.

The semiconductor device further comprises a second pillar adjacent to one side direction of the first pillar. The semiconductor layer is extended to the other sidewall of the second pillar.

The semiconductor device further comprises a third pillar adjacent to the other side direction of the first pillar. Also, the semiconductor device further comprises a buried insulating film located between the first pillar and the third pillar.

The semiconductor device further comprises a lower insulating film located in the lower portion of the buried insulating film.

The bit line includes $CoSi_2$.

The semiconductor device further comprises a lower junction region formed in the first pillar to be adjacent to the bit line.

The lower junction region is extended from the left side end to the right side end of the first pillar.

The semiconductor device further comprises an upper junction region located in the upper portion of the vertical channel region.

The semiconductor device further comprises a capacitor located in the upper portion of the first pillar and connected to the upper junction region.

The semiconductor device further comprises a gate extended in contact with the vertical channel region of the first pillar. The gate has the upper portion formed to be straight and the lower portion formed to have a step difference, which is not in contact with the semiconductor layer.

The semiconductor device further comprises a wall oxide layer located on the surface of the first pillar.

The semiconductor device further comprises a wall nitride layer or a spacer nitride layer located along the outside surface of the first pillar where the wall oxide layer is formed.

According to one aspect of an exemplary embodiment, a method for fabricating a semiconductor device comprises: forming a first trench in a semiconductor substrate; burying a bit line in the lower portion of both sides of the first trench; etching the semiconductor substrate to form a second trench; and forming a semiconductor layer in the second trench.

The forming-a-first-trench includes: forming a bit line mask over the semiconductor substrate; and etching the semiconductor substrate with the bit line mask.

After etching the semiconductor substrate, the method further comprises forming a wall oxide layer on the surface of the first trench.

After etching the semiconductor substrate, the method further comprises: forming a wall nitride layer at sidewalls of the first trench; etching the lower portion of the first trench at a given depth; and forming a lower oxide layer in the lower portion of the first trench.

The method further comprises forming a lower junction region in the lower portion of both sides of the first trench before burying the bit line.

The forming-a-lower-junction-region includes performing a plasma doping process with phosphorus (Ph) or arsenic (As).

The burying-a-bit-line includes: burying a metal material in the first trench; performing a rapid thermal annealing process on the first trench; and reacting the metal material with a silicon of the first trench to form a metal silicide.

After burying the bit line, the method further comprises forming a buried insulating film in the first trench.

The forming-a-second-trench includes: forming a body mask over the semiconductor substrate; and etching the semiconductor substrate with the body mask.

After etching the semiconductor substrate, the method further comprises forming a wall oxide layer on the surface of the second trench.

After etching the semiconductor substrate, the method further comprises: forming a polysilicon layer in the lower portion of the second trench; forming a spacer nitride layer at sidewalls of the second trench; removing a part of the polysilicon layer; removing the oxide layer disposed at the sidewalls of the first pillar; removing the polysilicon layer; and removing the oxide layer disposed in the lower portion of the second trench.

The removing-the-oxide-layer includes forming a contact of the first pillar.

In the removing-a-part-of-the-polysilicon-layer, the upper surface of the residual polysilicon layer has the same height as the upper surface of the lower junction region of the first pillar.

The polysilicon layer is an undoped polysilicon.

The forming-a-semiconductor-layer includes: depositing SiGe in the second trench; and etching-back the SiGe to remove a part of the SiGe.

The forming-a-semiconductor-layer includes performing a selective epitaxial process with the semiconductor substrate or the first pillar as a seed.

After removing a part of the SiGe, the method further comprises forming a capping film over the semiconductor layer in the second trench.

After forming the semiconductor layer, the method further comprises forming a gate in contact with the vertical channel region of the pillar formed by the first trench and the second trench.

The gate has the upper portion formed to be straight and the lower portion formed to have a step difference, which is not in contact with the semiconductor layer.

The method further comprises forming a capacitor located in the upper portion of the pillar and connected with an upper junction region disposed in the upper portion of the pillar.

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIGS. 1 to 11b are cross-sectional diagrams illustrating a method for fabricating a semiconductor device according to an embodiment of the present invention.

DESCRIPTION OF EMBODIMENTS

Exemplary embodiments of the present invention will be described in detail with reference to the attached drawings.

Figure 11A:
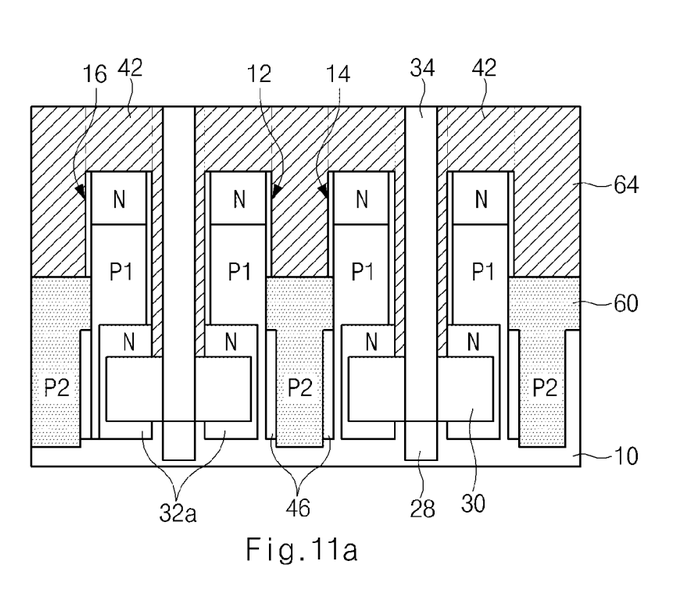
Figure 11B:
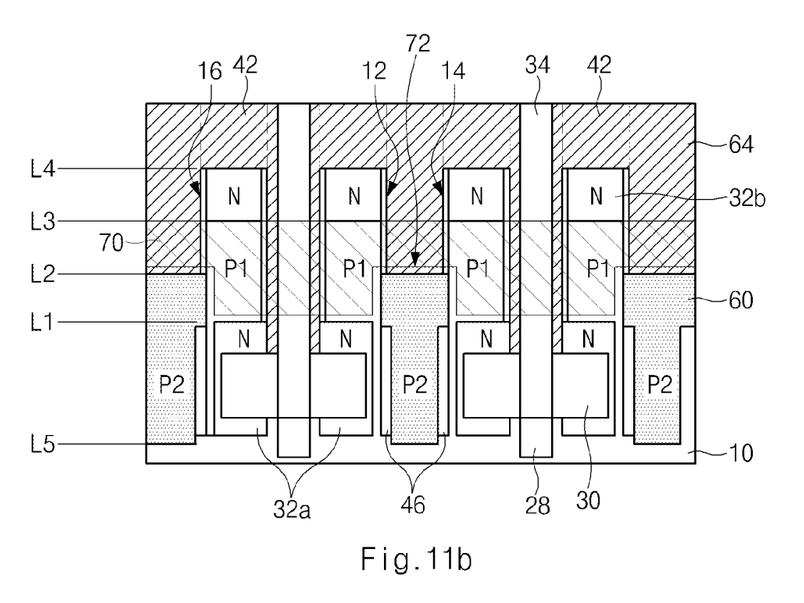

FIG. 11b is a cross-sectional diagram illustrating a semiconductor device according to an embodiment of the present invention.

Referring to FIG. 11b and also FIGS. 1-11a for reference numerals not shown in FIG. 11b, a plurality of pillars 12, 14, and 16, each including a vertical channel region P1, are disposed over a semiconductor substrate 10. These adjacent pillars are designated as a first pillar 12, a second pillar 14 and a third pillar 16. In the pillars 12, 14 and 16, an upper junction region N (also designated with 32b) is disposed over the vertical channel region P1 and a lower junction region 32a (it may be also represented by 'N') is disposed below the vertical channel region P1. Thus, a channel of the transistor is formed along the vertical channel region P1 located between the upper junction region N (32b) and the lower junction region 32a.

In the inner portion of the lower junction region 32a, a buried bit line 30 is buried inside each of the pillars 12, 14 and 16. The buried bit line 30 may include a metal silicide. Specifically, the buried bit line 30 may include a cobalt silicide ($CoSi_2$). The lower junction region 32a and the buried bit line 30 extend from the left end to the right end of the pillars 12, 14 and 16. In this case, a floating body effect may occur because the pillars 12, 14 and 16 are not electrically connected to the substrate 10.

Although the lower junction region 32a is represented by an N-type in FIG. 11b, it may be represented by a P-type. If the lower junction region 32a is formed with a N-type, as shown in FIG. 11b, the upper junction region N (32b) is also formed with a N-type and the vertical channel region P1 is formed with a P-type. On the other hand, if the lower junction region 32a is formed with a P-type, the upper junction region N (32b) is formed with a P-type and the vertical channel region P1 is formed with a N-type.

On the left and right side surfaces of the pillars 12, 14 and 16, wall oxide layers 26 and 46 are formed. These wall oxide layers 26 and 46, which have the same structure as that of a gate insulating film, are formed to protect the pillar surface including a silicon material, and may be obtained by performing a Chemical Vapor Deposition (CVD) process on High-K materials, such as SiO, ONO, $HfO_2x$, ZrO or PZT materials, or by heating the semiconductor substrate in a furnace. Also, the wall oxide layers 26 and 46 may be obtained by depositing High-K materials such as Zr or Hf on the surface of the pillars 12, 14 and 16 by an Atomic Layer Deposition (ALD) process to be subject to natural oxidation.

On the left and right side surfaces of the pillars 12, 14 and 16 with wall oxide layers 26 and 46, a wall nitride layer 27 and a spacer 54 are formed along the outside surface of the wall oxide layers 26 and 46. The wall nitride layer 27 and the spacer 54 are formed to protect the surface of the pillars 12, 14 and 16 and may include a nitride film with a low etch selectivity.

A semiconductor layer 60 (also referred to as a body tying conductive pattern) for connecting the pillar 12, 14 and 16 to the semiconductor substrate 10 is disposed adjacent to each pillar 12, 14, and 16. The semiconductor layer 60 may include semiconductor materials such as silicon germanium (SiGe) or silicon (Si) and is located between the two pillars 12 and 14. The lower end of the semiconductor layer 60 is coupled to the semiconductor substrate 10 and the upper end of the semiconductor layer 60 is coupled to a contact 56 of each pillar 12, 14 and 16 in left and right directions.

While the semiconductor layer 60 is formed between the first pillar 12 and the second pillar 14, an insulating film 34 is disposed between the first pillar 12 and the third pillar 16. The insulating film 34, which is designated as a 'buried insulating film', insulates the two adjacent pillars 12 and 16. Specifically, the insulating film 34 insulates the buried bit lines 30 of the adjacent pillars 12 and 16 from each other to reduce coupling capacitance between the two bit lines.

A lower oxide layer 28 including an oxide film is disposed in the lower portion of the buried insulating film 34, that is, in the lower portion between the first pillar 12 and the third pillar 16. Also, the lower oxide layer 28 may include a spin on dielectric (SOD). The lower oxide layer 28, as described below, serves as an insulator for insulating the two pillars 12 and 16 so that the junction region or the bit line may not be formed in the semiconductor substrate 10 between the adjacent pillars 12 and 16 in the process for forming the lower junction region 32a or forming the buried bit line 30.

A body mask 42 is disposed over the upper portion of each pillar 12, 14, and 16. The body mask 42 may include a nitride film and protects the upper surface of the pillars 12, 14 and 16 while simultaneously serving as a mask when the pillars 12, 14 and 16 are etched. Also, a capping film 64 for filling a space between the pillars 12, 14 and 16 to planarize the resulting structure may be disposed adjacent to the body mask 42.

As mentioned above, the semiconductor device according to an embodiment of the present invention comprises the semiconductor layer 60 for electrically coupling each pillar 12, 14 and 16 to the semiconductor substrate 10. The semiconductor layer 60 can prevent the floating body effect. Thus, each pillar 12, 14 and 16 is prevented from being floated. A part of the vertical channel region P1 in the pillars 12, 14 and 16 may be designated as a 'body' and thus, the semiconductor device has a body-tied structure for connecting the body of the pillars 12, 14 and 16 directly to the semiconductor substrate 10.

Since the buried bit line 30 is not formed in a space between the pillars 12, 14 and 16, but is formed inside the pillars 12, 14 and 16, a space between the bit lines 30 in the adjacent pillars 12, 14 and 16 is sufficient to reduce the coupling capacitance.

To further explain the advantages of the present invention, as illustrated by the embodiments described above, features of the present invention will be discussed further.

Referring to FIG. 11b, a plurality of pillars 12, 14, and 16 extends from a substrate. A body tying conductive pattern 60 is arranged in an alternative manner between the plurality of pillars 12, 14, and 16. The body tying conductive pattern 60 is configured to couple any of neighboring pillars 12 and 14 to the substrate 10.

Any of the plurality of pillars 12, 14, and 16 includes a first bit line 30, which is insulated from the body tying conductive pattern 60. The first bit line 30 is formed at a first level L1. The body tying conductive pattern 60 is coupled to any of the plurality of pillars 12, 14, and 16 at a second level L2. The second level L2 is higher than the first level L1.

Each of the plurality of pillars 12, 14, and 16 includes a channel P1. The channel P1 is formed along a sidewall of each of the plurality of pillars 12, 14, and 16 and is coupled to the first bit line 30. The channel P1 extends to a third level L3 that is higher than the second level L2.

Each of the plurality of pillars 12, 14, and 16 further includes a first junction 32a. The first bit line 30 is coupled to the channel P1 through the first junction 32a.

Each of the plurality of pillars 12, 14, and 16 further includes a second junction 32b coupled to the first junction 32a through the channel P1. The second junction 32b is disposed in a fourth level L4 that is higher than the third level L3. The body tying conductive pattern 60 is commonly coupled to two neighboring pillars 12 and 14. The body tying conductive pattern 60 substantially fills a space between neighboring pillars 12 and 14. The substrate 10 is at a fifth level L5 lower than the first level L1, and the body typing conductive pattern 60 extends from the second level L2 down to the substrate 10 at the first level L5.

As shown in FIGS. 1-11b, first trench 24 is formed in a substrate 10 to create a pre-pillar pattern 10a. See FIGS. 1-3. A first bit line 30 extends from a lower sidewall of the first trench 24 into a sidewall of the pre-pillar pattern 10a. See FIG. 4.

A second trench 44 is formed in the middle of the pre-pillar pattern 10a to form first and second pillars 12 and 14. See FIG. 6. A body tied conductive pattern 60 is formed in the second trench 44 to couple any of the first and the second pillars 12 and 14 to the substrate 10. See FIGS. 10-11b. The body tied conductive pattern 60 may be commonly coupled to both of the first and the second pillars 12 and 14. See FIGS. 10-11b.

FIGS. 1-11b are cross-sectional diagrams illustrating a method for fabricating a semiconductor device according to an embodiment of the present invention.

Hereinafter, a method for forming a semiconductor device according to an embodiment of the present invention will be described in more detail with reference to FIGS. 1-11b.

Figure 1:
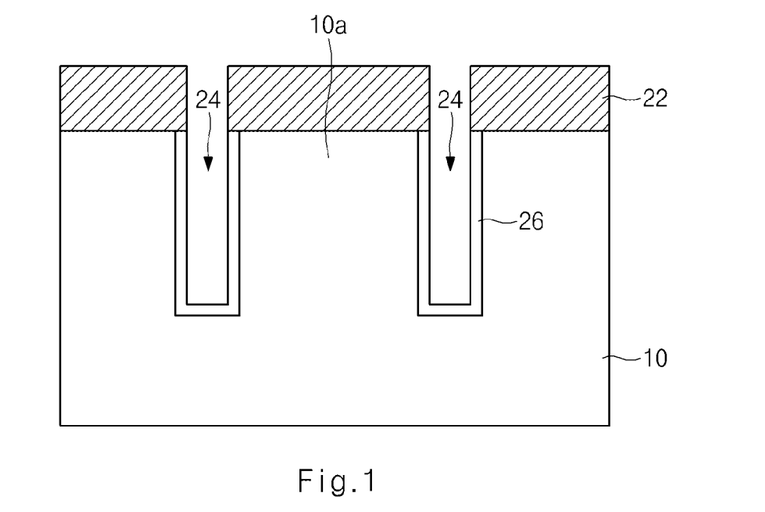
Figure 2:
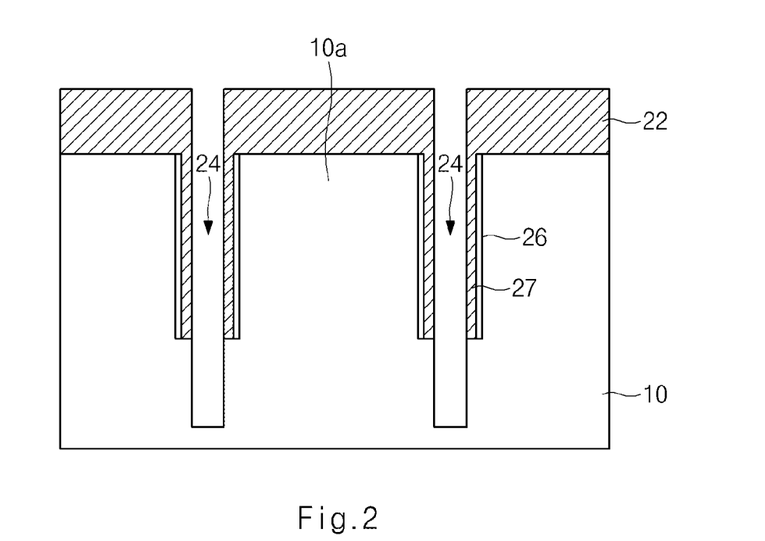

Referring to FIGS. 1-2, a bit line mask 22 is formed with a given pattern over a semiconductor substrate 10, and the semiconductor substrate 10 is etched using the bit line mask 22 as a mask to form a first trench 24. The first trench 24 corresponds to a space between the first pillar 12 and the third pillar 16, which will be formed in a subsequent process. Thereafter, an oxidation process is performed on the first trench 24 to form the wall oxide layer 26 on the surface of the first trench 24. The wall oxide layer 26 corresponds to the wall oxide layer 26 located on the left side surface of the first pillar 12, the right side surface of the third pillar 16, and the right side surface of the second pillar 14. The wall oxide layer 26 serves to protect the surface of the first trench 24. For the bit line mask 22, various materials may be used, such as a photoresist film, an oxide film, a nitride film, a silicon oxide nitride film, or an amorphous carbon layer. Preferably, a nitride film is used with a high etch selectivity compared to the semiconductor substrate 10, which includes a silicon (Si) material.

As shown in FIG. 2, after performing a cleaning process, a nitride film is buried in the first trench 24 and then, an anisotropic etch or spacer etch process is performed to remove the nitride film disposed in the bottom of the first trench so that the wall nitride layer 27 is formed only at sidewalls of the first trench 24. In this process, the first trench 24 is etched more deeply than shown in the drawing of FIG. 2, and the lower portion of the first trench 24, which is more deeply etched, does not include the wall oxide layer 26 or the wall nitride layer 27.

Figure 3:
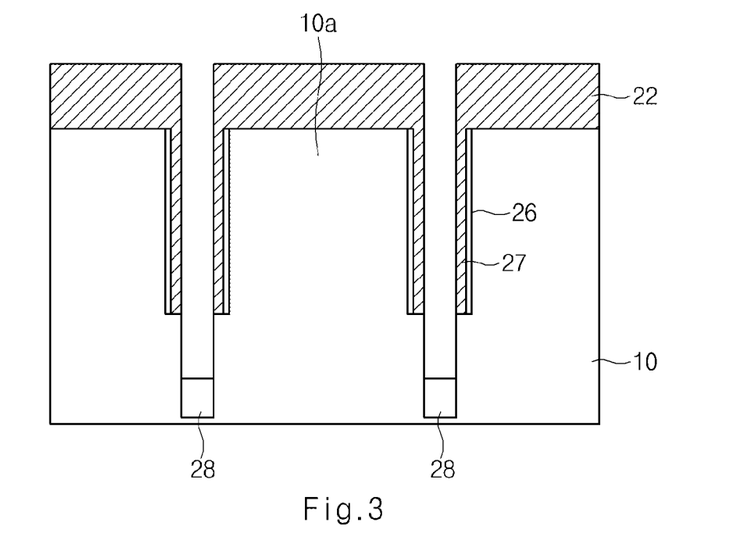

Referring to FIG. 3, the lower oxide layer 28 is formed in the lower portion of the first trench 24. In this process, after an oxide film is buried in the first trench 24, an etch-back process is performed so that the oxide film remains only in the bottom of the first trench 24. The lower oxide layer 28, as mentioned above, serves to insulate the two pillars 12 and 16 so that the junction region or the bit line is not formed in the semiconductor substrate 10 between the adjacent pillars 12 and 16 in a subsequent process when the lower junction region 32a (see FIG. 4) or the buried bit line 30 (see FIG. 4) is formed.

Figure 4:
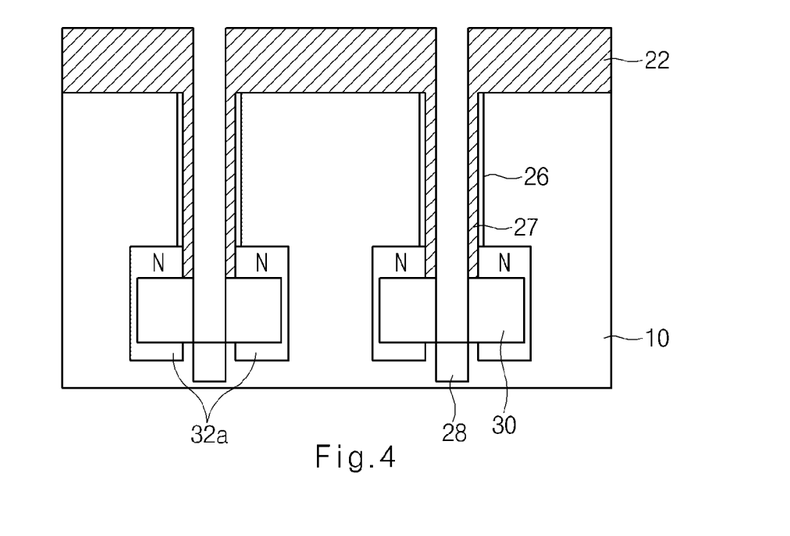

As shown in FIG. 4, the lower junction region 32a is formed in a region where the silicon of the first trench 24 is exposed (the lower portion of the wall nitride layer 27 and the upper portion of the lower oxide layer 28). There are various methods for forming the lower junction region 32a and specifically, an ion-implanting process or a plasma doping (PLAD) process may be used. The plasma doping process may be performed with phosphorus (Ph) or arsenic (As). As mentioned above, the lower junction region 32a may be formed with an N-type or P-type.

A metal material (not shown) is buried in the first trench 24 and a rapid thermal annealing (RTA) process is performed to form the buried bit line 30 on the left and right sides of the first trench 24. If the rapid thermal annealing process is performed, the metal material (not shown) reacts with the silicon (Si) of the first trench 24 to form a metal silicide on the left and right sides of the first trench 24. If the metal material is a cobalt (Co), the buried bit line 30 is formed with a cobalt silicide ($CoSi_2$). The metal silicide operates as a bit line in the semiconductor device and designated as the buried bit line 30. After the rapid thermal annealing process, a cleaning process is performed to remove the metal material (not shown) that remains inside the first trench 24, that is, the metal material (not shown) that has not reacted with the silicon (without forming a silicide) by the wall nitride layer 27 or the lower oxide layer 28.

Figure 5:
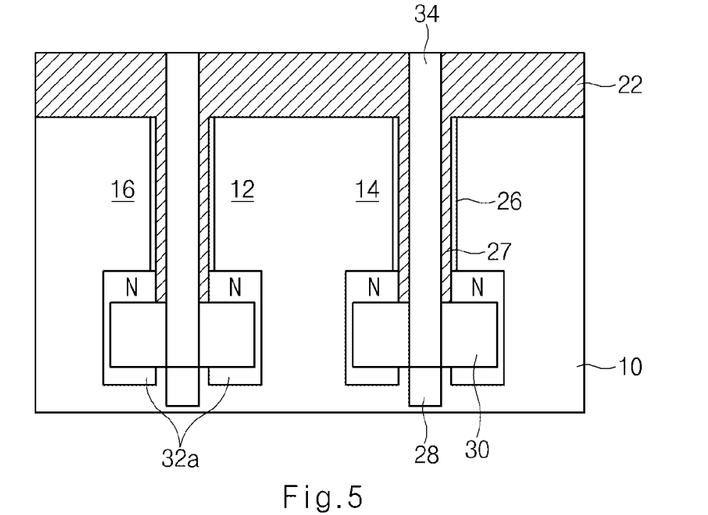

Referring to FIG. 5, a buried insulating film 34 is buried in the first trench 24 and a planarizing etch process is performed to remove the buried insulating film disposed over the bit line mask 22. The buried insulating film 34 serves as an insulator for insulating the first pillar 12 and the third pillar 16 from each other. Specifically, the buried insulating film 34 insulates the buried bit lines 30 of the two pillars 12 and 16 from each other. The buried insulating film 34 may include $SiO_2$, Boron Phosphorus Silicate Glass (BPSG), Phosphorus Silicate Glass (PSG), Tetra Ethyl Ortho Silicate (TEOS), Un-doped Silicate Glass (USG), Spin On Glass (SOG), High Density Plasma (HDP), Spin On Dielectric (SOD), Plasma Enhanced Tetra Ethyl Ortho Silicate (PE-TEOS) and Silicon Rich Oxide (SROx). Preferably, the buried insulating film includes SOD.

Figure 6:
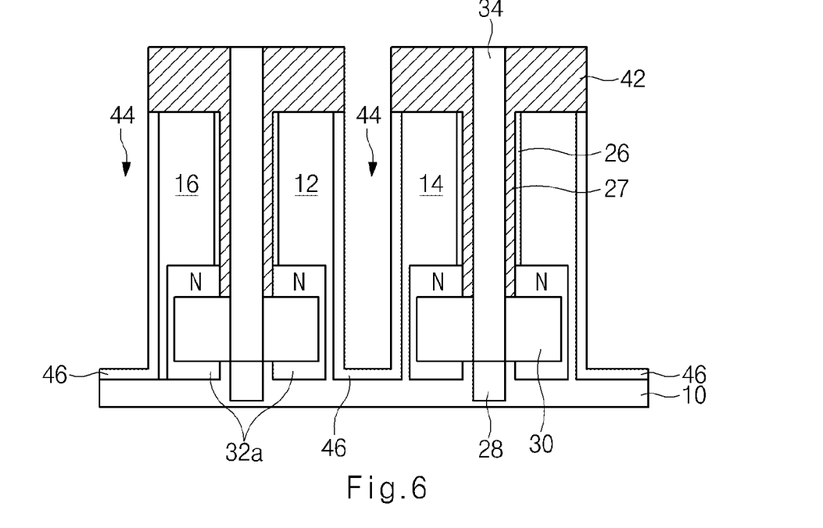

As shown in FIG. 6, the bit line mask 22 is etched with a given pattern to form the body mask 42. The semiconductor substrate 10 is re-etched with the body mask 42 as a mask to form a second trench 44 while simultaneously forming the first and second pillars 12 and 14. The second trench 44 corresponds to a space between the first pillar 12 and the second pillar 14. An oxidation process is performed on the second trench 44 to form the wall oxide layer 46 on the surface of the second trench 44. The wall oxide layer 46 is located on the right side surface of the first pillar 12, the left side surface of the third pillar 16, and the right side surface of the second pillar 14. The wall oxide layer 46 serves to protect surfaces of the pillars 12, 14, and 16 including the silicon Si.

Figure 7:
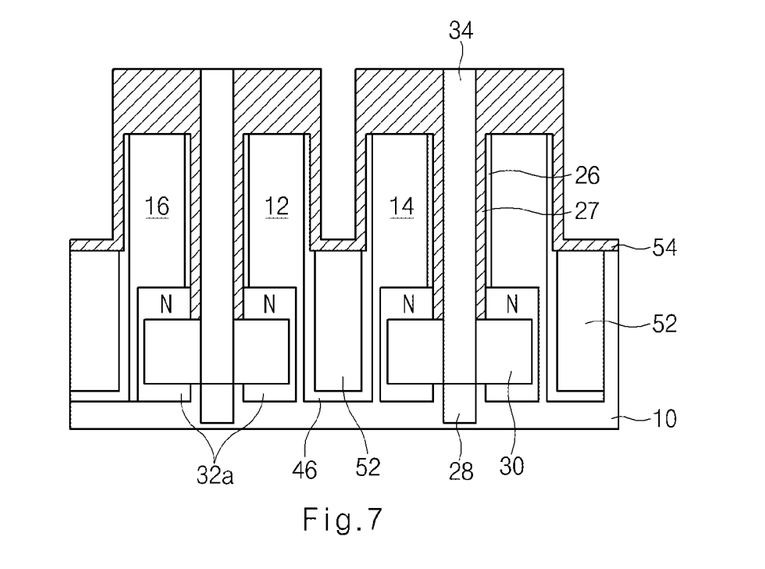

Referring to FIG. 7, a polysilicon layer 52 is formed to a given depth in the second trench 44. A spacer nitride layer 54 is formed at sidewalls of the second trench 44. This process may include: (i) after burying a polysilicon material in the second trench 44, performing an etch-back process so that the polysilicon layer 52 remains only in the lower portion of the second trench 44; and (ii) after burying a nitride film in the second trench 44, performing an etch-back process so that the spacer nitride layer 54 remains only at the sidewalls of the second trench 44. The polysilicon layer 52 is deposited to a given depth so that its upper surface is higher than the top end of the lower junction region 32a. Preferably, the upper surface of the polysilicon layer 52 corresponds to the middle of the vertical channel region P1, to be formed in a subsequent process (See FIG. 11a). The polysilicon layer 52 may include an undoped polysilicon and may be substituted with a material, which is not the polysilicon, with an etch selectivity that is different from the silicon and the oxide film.

Figure 8:
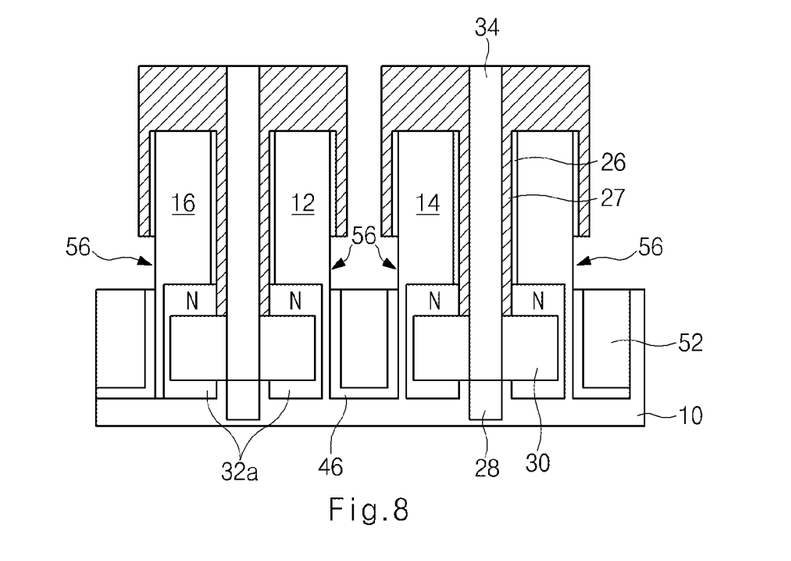

As shown in FIG. 8, an anisotropic etch process is performed to remove the spacer nitride film 54 disposed over the polysilicon layer 52. After the polysilicon layer 52 is etched to a given height, an oxide cleaning process is performed to remove a part of the wall oxide layer 46, thereby opening a contact 56 in the pillars 12, 14 and 16. The contact 56, which is a space where the silicon material of the pillars 12, 14 and 16 is exposed, is designated as a space where the wall oxide layers 26 and 46 or the spacer 54 is not formed. When part of the polysilicon layer 52 is removed, the upper surface of the polysilicon layer 52 corresponds to the height of the upper surface of the lower junction region 32a.

Figure 9:
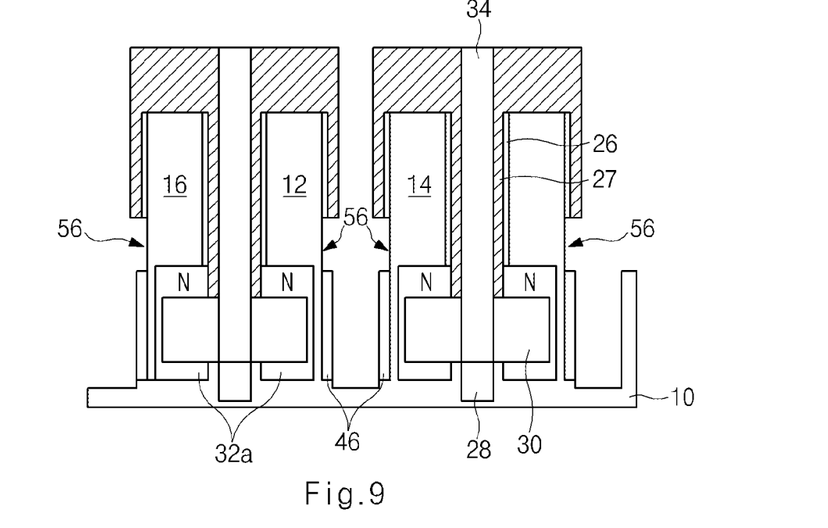

Referring to FIG. 9, a cleaning process is performed to remove the residual polysilicon layer 52 after the contact 56 is formed. The wall oxide layer 46 (see FIG. 6), which is disposed over sidewalls in the bottom of the second trench 44, is also removed. As a result, the surface of the semiconductor substrate 10 between the first pillar 12 and the second pillar 14 is exposed.

Figure 10:
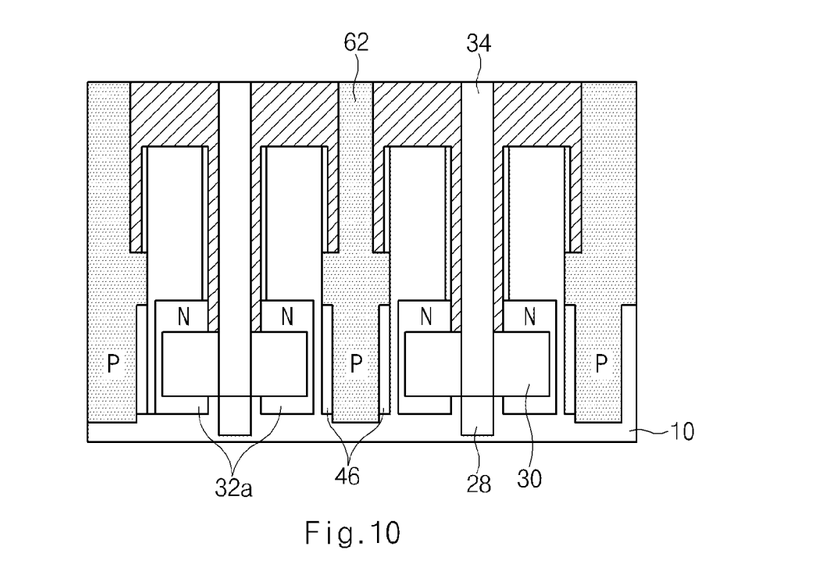

As shown in FIG. 10, while the surface of the semiconductor substrate 10 and the contact 56 of the pillars 12, 14 and 16 are exposed, a semiconductor material 62 is buried in the second trench 44. The semiconductor material 62 may include a silicon germanium (SiGe) or a silicon (Si). If the semiconductor material 62 includes SiGe, a method of depositing SiGe may be used. If the semiconductor material 62 includes Si, a selective epitaxial growth (SEG) process may be used with the semiconductor substrate 10 or the pillars 12, 14 and 16 as a seed.

Referring to FIG. 11a, an etch-back process is performed to remove a part of the semiconductor material 62 in the second trench 44, thereby forming the semiconductor layer 60 (or the body tying conductive pattern). A capping film 64 is deposited to fill in the rest of the second trench 44 to planarize the resulting structure. The capping film 64 may include a nitride film.

As shown in FIG. 11b, a gate 70, connected to the vertical channel region P1 of the pillars 12, 14 and 16, is formed. The gate 70 extended in left and right directions has the upper portion to be straight and the lower portion to have a step difference 72 without being in contact with the semiconductor layer 60. Although it is not shown, the gate 70 may be formed to have a double gate structure that extends in a vertical direction to the buried bit line 30 in a plane view, and that is in contact with both side surfaces of the pillars 12, 14 and 16.

Although they are not shown, a channel ion-implanting process and an upper junction region ion-implanting process may be performed on the pillars 12, 14 and 16. The body mask 42 disposed over the pillars 12, 14 and 16 is removed to form a capacitor connected to the upper junction region N.

The above-described method for fabricating a semiconductor device according to the embodiment of the present invention comprises forming the semiconductor layer 60 for electrically coupling each of the pillars 12, 14 and 16 to the semiconductor substrate 10, thereby preventing the floating body effect wherein each pillar 12, 14 and 16 is floated by being separated from the semiconductor substrate 10 by the lower junction region 32 and the buried bit line 30.

Also, a method for fabricating a semiconductor device according to an embodiment of the present invention may reduce the coupling capacitance by providing sufficient space between the bit lines 30 in the adjacent pillars 12, 14 and 16 because the buried bit line 30 is not formed in a space between the pillars 12, 14 and 16, but is inside the pillars 12, 14 and 16.

FIGS. 12 to 15 are cross-sectional diagrams illustrating a method for fabricating a semiconductor device according to another embodiment of the present invention, which correspond to FIGS. 1-4. FIGS. 12-15 show another example for forming the lower junction region 32a and the buried bit line 30. The process for forming the contact 56 in the pillars 12, 14 and 16 using the polysilicon layer 52, as shown in FIGS. 7 and 8, may be applied to the process for forming the lower junction region 32a and the buried bit line 30.

Figure 12:
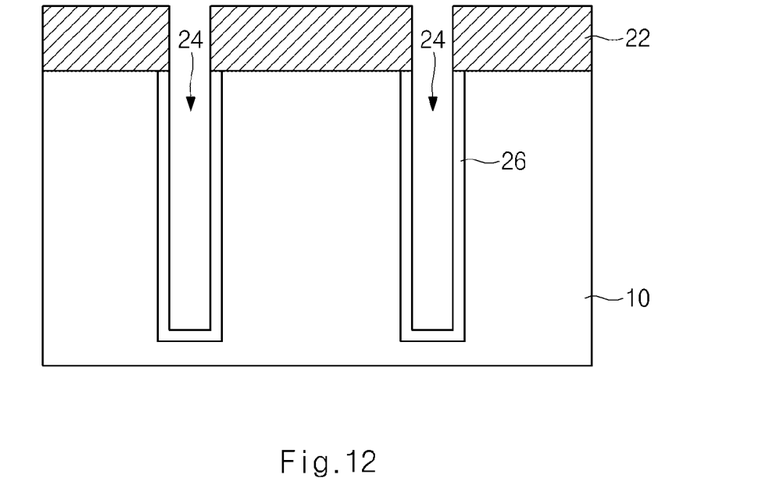
FIGS. 12 to 15 are cross-sectional diagrams illustrating a method for fabricating a semiconductor device according to another embodiment of the present invention.

FIG. 12, which is substantially the same as FIG. 1, shows that the semiconductor substrate 10 is etched with the bit line mask 22 as a mask to form the first trench 24 and the wall oxide layer 26.

Figure 13:
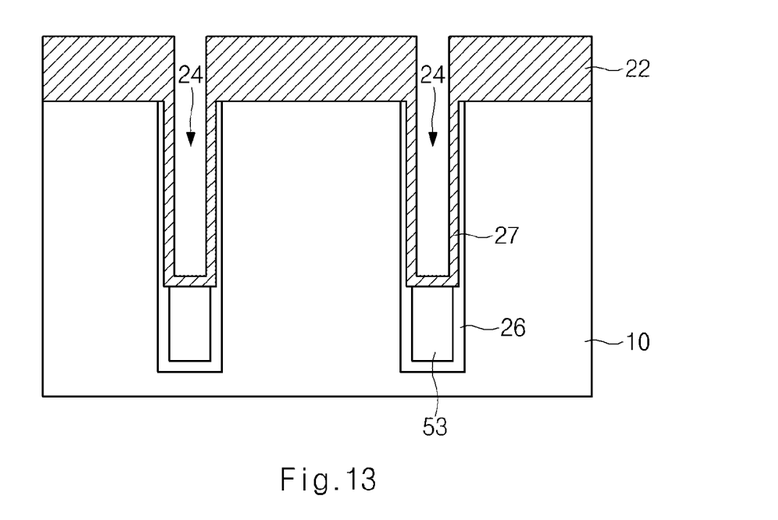
Figure 14:
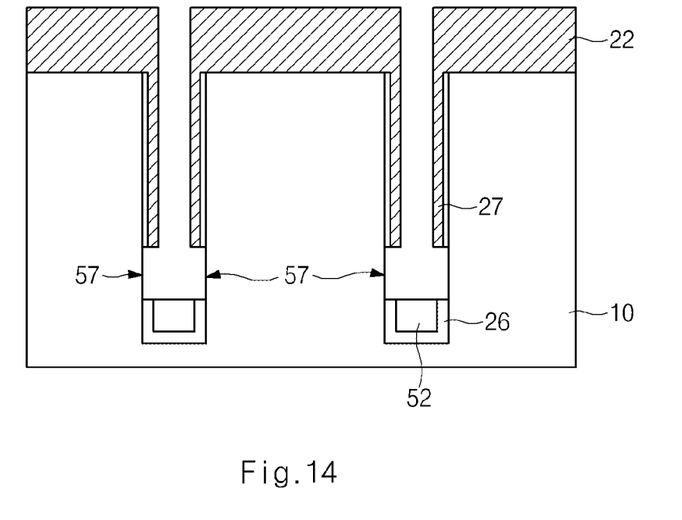

Referring to FIG. 13, a polysilicon layer 53 is formed to a given depth in the lower portion of the first trench 24 and a spacer nitride layer 27 is formed at the sidewalls of the second trench 24. This process may include: (i) after burying a polysilicon material in the first trench 24, performing an etch-back process so that the polysilicon layer 53 remains with a given depth only in the lower portion of the first trench 24; and (ii) after burying a nitride film in the first trench 24, performing an etch-back process so that the spacer nitride layer 27 remains only at the sidewalls of the first trench 24. The polysilicon layer 53 may include an undoped polysilicon and may be substituted with a material, which is not the polysilicon, with an etch selectivity that is different from the silicon and the oxide film.

Referring to FIG. 13, a bottom portion of the spacer nitride layer 27 and an upper portion of the polysilicon layer 53 are etched. As a result, a contact 57, which is a space where the silicon material of semiconductor substrate 10 is exposed, is formed.

Figure 15:
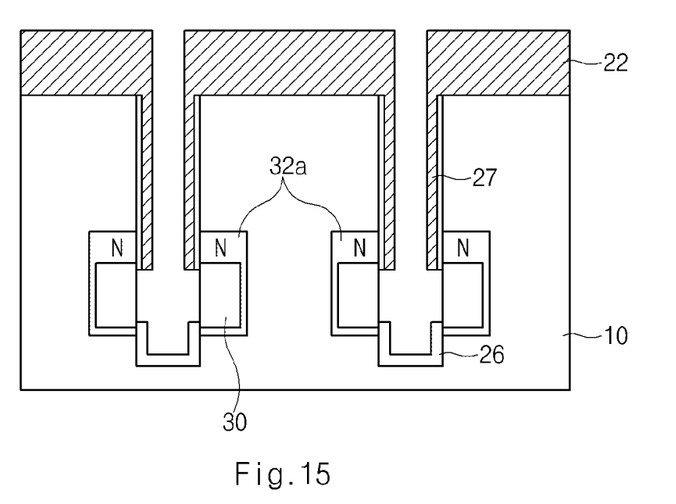

As shown in FIGS. 15, the lower junction region 32a and the buried bit line 30 are formed through the contact 57 where the silicon of the first is trench 24 is exposed. In the process for forming the lower junction region 32a and the buried bit line 30, the same process as that of FIG. 4 may be applied and thus the repeated explanation is omitted. Thereafter, the semiconductor device comprising the vertical transistor may be formed by the processes shown in FIGS. 5 to 11a.

The above-described memory device according to an embodiment of the present invention can be used, for example, in desktop computers, portable computers, computing memories used in servers, graphics memories having various specs, and mobile electronic devices as technology continues to evolve. Further, the above-described semiconductor device may be provided to various digital applications such as mobile recording mediums including a memory stick, multimedia card (MMC), secure digital (SD), compact flash (CF), extreme digital (xD) picture card, and a universal serial bus (USB) flash device as well as various applications such as MP3P, portable multimedia player (PMP), a digital camera, a camcorder, and a mobile phone. A semiconductor device may be applied to a technology such as multi-chip package (MCP), disk on chip (DOC), or embedded device. The semiconductor device may be applied to a CMOS image sensor to be provided to various fields such as a camera phone, a web camera, and a small-size image capture device for medicine.

As described above, the semiconductor device and the method for fabricating the same according to an embodiment of the present invention may prevent the floating body effect and reduce the coupling capacitance between the buried bit lines.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device comprising:
    a plurality of pillars extending from a substrate, each of the plurality of pillars having a body portion; and
    a body tying conductive pattern arranged between the plurality of pillars, the body tying conductive pattern having an upper surface extending in a single plane between the plurality of pillars,
    wherein the body tying conductive pattern is coupled between the body portion of a pillar of the plurality of pillars and the substrate.

2. The semiconductor device of claim 1,
    wherein at least one of the plurality of pillars includes a first bit line insulated from the body tying conductive pattern.

3. The semiconductor device of claim 2,
    wherein the first bit line is formed at a first level,
    wherein the body tying conductive pattern is coupled to any of the plurality of pillars at a second level, and
    wherein the second level is higher than the first level.

4. The semiconductor device of claim 3,
    wherein each of the plurality of pillars further includes a channel formed along a sidewall of each of the plurality of pillars and coupled to the first bit line, and
    wherein the channel extends to a third level higher than the second level.

5. The semiconductor device of claim 4,
    wherein each of the plurality of pillars further includes a first junction, and
    wherein the first bit line is coupled to the channel through the first junction.

6. The semiconductor device of claim 5,
    wherein each of the plurality of pillars further includes a second junction coupled to the first junction through the channel, and
    wherein the second junction is disposed at a fourth level higher than the third level.

7. The semiconductor device of claim 1,
    wherein the body tying conductive pattern is coupled to two neighboring pillars.

8. The semiconductor device of claim 1,
    wherein the body tying conductive pattern substantially fills a space between neighboring pillars.

9. The semiconductor device of claim 3,
    wherein the substrate is at a fifth level lower than the first level, and
    wherein the body tying conductive pattern extends from the second level down to the substrate at the first level.

10. The semiconductor device of claim 1, further comprising a buried insulating film located between the plurality of pillars.

11. The semiconductor device of claim 7, further comprising a contact disposed on at least one of side walls of the neighboring pillars contacting the substrate.

12. The semiconductor device of claim 3, wherein the body tying conductive pattern is coupled to a contact disposed on a sidewall of a pillar of the plurality of pillars.

13. The semiconductor device of claim 12, wherein the contact is an exposed portion of the pillar.

14. The semiconductor device of claim 4, further comprising a gate coupled to the channel.

15. The semiconductor device of claim 14, wherein the gate has an upper portion formed to be even and a lower portion formed to have a step difference, and
wherein the gate is not in contact with the body tying conductive pattern.

16. The semiconductor device of claim 1, further comprising a wall oxide layer located over a surface of the plurality of pillars.

17. The semiconductor device of claim 16, further comprising a wall nitride layer or a spacer nitride layer located over the wall oxide layer.

18. The semiconductor device of claim 6, further comprising a capacitor located in an upper portion of the plurality of pillars and coupled to the second junction.

19. A semiconductor device comprising:
a plurality of pillars extending from a substrate; and
a body tying conductive pattern arranged between the plurality of pillars, the body tying conductive pattern having an upper surface extending in a single plane between the plurality of pillars,
wherein the body tying conductive pattern is configured to couple any of neighboring pillars to the substrate, and
wherein at least one of the plurality of pillars includes a first bit line insulated from the body tying conductive pattern.

20. A semiconductor device comprising:
a plurality of pillars extending from a substrate; and
a body tying conductive pattern arranged between the plurality of pillars, the body tying conductive pattern having an upper surface extending in a single plane between the plurality of pillars,
wherein the body tying conductive pattern is configured to couple any of neighboring pillars to the substrate, and
wherein the body tying conductive pattern is coupled to two neighboring pillars.

* * * * *